United States Patent
Bagga

(10) Patent No.: US 12,451,868 B2
(45) Date of Patent: Oct. 21, 2025

(54) FILTER

(71) Applicant: Novelda AS, Kviteseid (NO)

(72) Inventor: Sumit Bagga, Kviteseid (NO)

(73) Assignee: Novelda AS, Kviteseid (NO)

( * ) Notice: Subject to any disclaimer, the term of this patent is extended or adjusted under 35 U.S.C. 154(b) by 0 days.

(21) Appl. No.: 18/023,319

(22) PCT Filed: Aug. 23, 2021

(86) PCT No.: PCT/EP2021/073252
§ 371 (c)(1),
(2) Date: Feb. 24, 2023

(87) PCT Pub. No.: WO2022/048932
PCT Pub. Date: Mar. 10, 2022

(65) Prior Publication Data
US 2023/0308082 A1    Sep. 28, 2023

(30) Foreign Application Priority Data
Sep. 3, 2020   (GB) ...................... 2013859

(51) Int. Cl.
*H03H 11/04*   (2006.01)

(52) U.S. Cl.
CPC .  *H03H 11/0427* (2013.01); *H03H 2011/0488* (2013.01)

(58) Field of Classification Search
CPC ................... H03H 2011/0488; H03H 11/0427
See application file for complete search history.

(56) References Cited

U.S. PATENT DOCUMENTS 6,097,269 A * 8/2000 Hernandez ........... H03H 7/0115
                                                    455/340
7,180,950 B2 * 2/2007 Engel ...................... H04B 3/30
                                                    375/216
(Continued)

FOREIGN PATENT DOCUMENTS

CN     111342805 A    6/2020
EP   0 402 873 A2   12/1990
(Continued)

OTHER PUBLICATIONS

Ang et al., "A Multi-band CMOS Low Noise Amplifier for Multi-standard Wireless Receivers," *IEEE International Symposium on Circuits and Systems*, 2007, pp. 2802-2805.
(Continued)

*Primary Examiner* — Menatoallah Youssef
*Assistant Examiner* — Khareem E Almo
(74) *Attorney, Agent, or Firm* — Klarquist Sparkman, LLP

(57) ABSTRACT

A filter circuit comprising: a signal path for carrying a signal from an input to an output; the signal path comprising a first reactive component; a first node on the signal path; a first series resonant circuit comprising at least a second reactive component in series with a third reactive component, the first series resonant circuit being connected between the first node and a ground; an active circuit; the active circuit comprising a voltage controlled current source (VCCS) arranged to change the current flow through the second reactive component in dependence on a voltage sensed (or measured) on the signal path. The first series resonant circuit forms a single harmonic trap with a notch frequency defined by the component values of its reactive components. The effectiveness of the series resonant circuit is dependent upon (Continued)

the strength with which it draws current from the signal path at its resonant frequency.

15 Claims, 9 Drawing Sheets

(56) References Cited

U.S. PATENT DOCUMENTS

| | | | |
|---|---|---|---|
| 7,522,017 B1* | 4/2009 | Groe | H03H 7/0153 |
| | | | 333/175 |
| 7,999,608 B1 | 8/2011 | Groe et al. | |
| 2004/0219900 A1* | 11/2004 | Zheng | H03H 11/1213 |
| | | | 455/302 |
| 2008/0079497 A1* | 4/2008 | Fang | H03F 3/193 |
| | | | 330/302 |
| 2008/0266005 A1 | 10/2008 | Jacobsson et al. | |
| 2009/0085818 A1* | 4/2009 | Rohani | H03H 7/1775 |
| | | | 343/747 |
| 2012/0161862 A1 | 6/2012 | Uzunov et al. | |
| 2020/0412320 A1* | 12/2020 | Reid | H03H 7/06 |
| 2023/0090893 A1* | 3/2023 | Erb | H03K 17/002 |
| | | | 333/124 |
| 2024/0072766 A1* | 2/2024 | Fard | H03H 9/205 |

FOREIGN PATENT DOCUMENTS

| | | |
|---|---|---|
| JP | 63-157501 | 6/1988 |
| WO | WO 2018/033746 A1 | 2/2018 |

OTHER PUBLICATIONS

International Search Report and Written Opinion for PCT/EP2021/073252, mailed Dec. 8, 2021, 21 pages.
IPO Search Report under Section 17(5) for GB2013859.0, mailed Feb. 25, 2021, 3 pages.

* cited by examiner

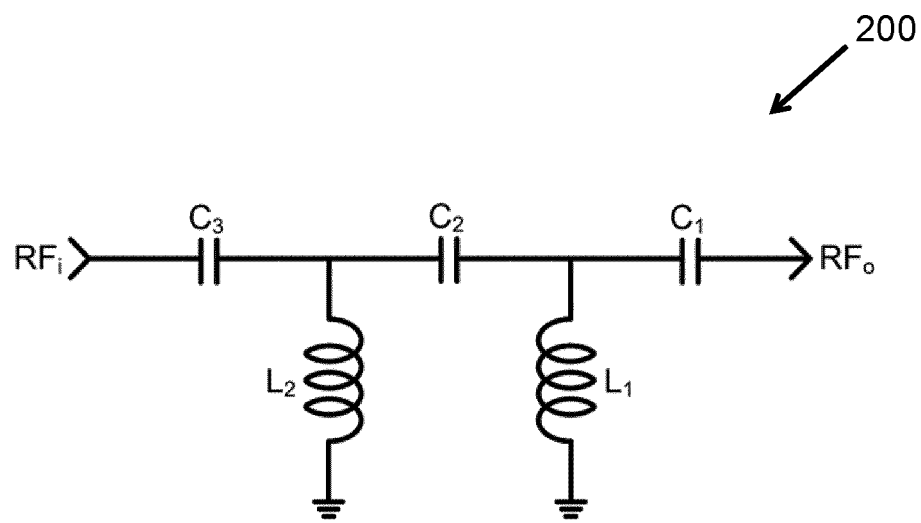
Fig. 2
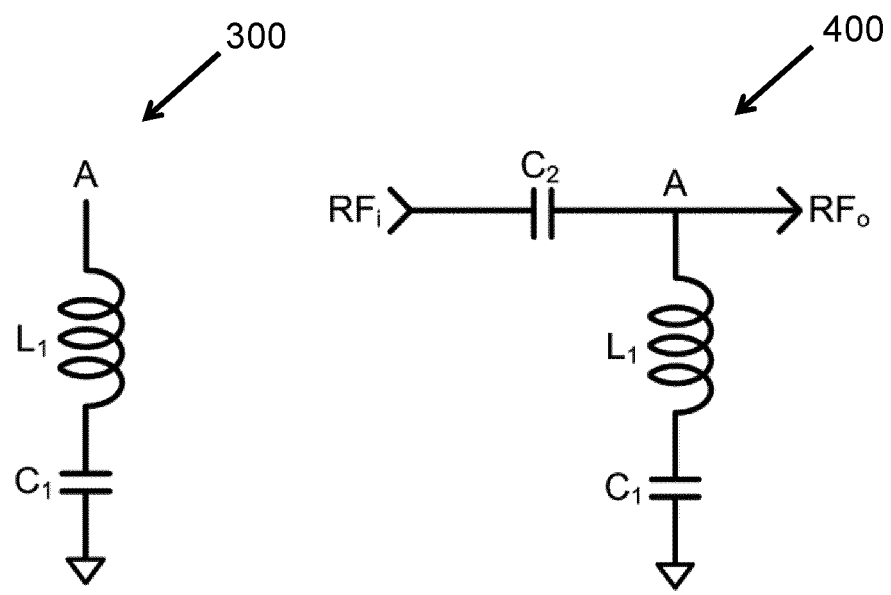
Fig. 3                    Fig. 4

FILTER

CROSS REFERENCE TO RELATED APPLICATIONS

This is the U.S. National Stage of International Application No. PCT/EP2021/073252, filed Aug. 23, 2021, which was published in English under PCT Article 21(2), which in turn claims the benefit of Great Britain Application No. 2013859.0, filed Sep. 3, 2020.

The invention relates to filters, such as high-pass or low-pass filters, typically for use in radio frequency systems, most particularly in relation to filters employed to exclude frequencies at and below wireless LAN.

High-pass filters are commonly used in RF radio front-ends to exclude unwanted frequencies from further processing, e.g. to remove out-of-band interferers. With the ever-increasing number of wirelessly communicating devices and limited spectrum resources, interference is a problem. For optimal operation and co-existence, it is therefore all the more important to heavily exclude those areas of spectrum that are not of interest.

One particular area of interest is the UWB spectra. The usable spectrum varies from region to region, e.g., in the US, transmissions may use the 3.1 to 10.6 GHz band. In Europe, transmissions may use the 6 to 8.5 GHz band. It will be appreciated that for use of these spectrum bands, rejection of IEEE 802.11 wireless LAN frequencies (2.4 GHz and 5 GHz) becomes very important.

For high volume production of inexpensive products, the hardware cost is also a very important factor.

Passive filters (RL, LC, RLC) employ high Q-factor reactive components in order to optimize performance metrics, such as insertion loss (low), passband to stopband transition (fast) and group delay (flat). However, the best quality components (with the highest Q values) are generally expensive to manufacture. For example, to improve the Q of an inductor/coil, thicker wires/metals (with lower intrinsic resistances) are required. In integrated circuits this means depositing thicker layers of metal (e.g., Cu/Al with high conductivity) during fabrication, which is a time-consuming process, and thus expensive. Similarly, the high Q value capacitors use MIM (metal-insulator-metal) technology and are significantly more expensive than the cheaper MOM (metal-oxide-metal) components. Therefore, high quality passive filters generally require expensive components to achieve low insertion loss, fast passband to stopband transition and high in-band and/or out-of-band rejection.

Fast frequency transitions are important in UWB applications as it is desirable for such applications to use as much as possible of the available spectrum. If the passband to stopband roll-off of the filter is less abrupt, then a high rejection notch placed at the lower end of the passband will eat into the usable spectrum. A trade-off then has to be made between higher rejection at the upper end of the stopband versus lower rejection at the lower end of the passband. A high-Q filter with faster frequency transitions allows the best of both worlds.

Other solutions for increasing the sharpness of a passive filter profile include employing higher order filters (i.e., increasing the number of reactive components). However, additional components generally require more die area, which in turn adds to the cost, and will most likely result in higher insertion loss.

According to one aspect of the invention, there is provided a filter circuit comprising: a signal path for carrying a signal from an input to an output; the signal path comprising a first reactive component; a first node on the signal path; a first series resonant circuit comprising at least a second reactive component in series with a third reactive component, the first series resonant circuit being connected between the first node and a ground; an active circuit; the active circuit comprising a voltage controlled current source (VCCS) arranged to change the current flow through the second reactive component in dependence on a voltage sensed (or measured) on the signal path.

The first series resonant circuit (also referred to as a series single-tuned filter) forms a single harmonic trap with a notch frequency defined by the component values of its reactive components. A typical series resonant circuit is formed from an inductive component (with reactance $X_L$) and a capacitive component (with reactance $X_C$) connected together in series. At the resonant frequency, the reactances of the two components cancel (i.e., $X_C-X_L=0$) and the series resonant circuit forms a short that sinks the signal to ground, thus removing (or significantly reducing) that frequency component from the signal being passed along the signal path. The orthogonally placed first series resonant circuit essentially taps the unwanted signal off the signal path, without affecting the desired signal which is allowed to pass unimpeded along the signal path.

The use of a series resonant circuit to eliminate signal from the signal path is advantageous because the series resonant circuit does not form part of the signal path. Only the interfering signal is removed. For a series resonant circuit, the circuit impedance is minimum and entirely resistive at resonance. Moreover, at resonance, voltage across the capacitor ($V_C$) is equal to, but in anti-phase to voltage across the inductor ($V_L$), and the circuit current is at maximum. Below the resonance, the circuit is capacitive ($X_C > X_L$), and above the resonance, the circuit is inductive ($X_L > X_C$).

The use of the series resonant circuit means that the overall circuit has a low insertion loss. By comparison, parallel resonant circuits (e.g. an inductor in parallel with a capacitor) used to block signals at a specific resonant frequency need to be placed in line in the signal path and therefore, while they provide high (ideally infinite) impedance to the signal at frequencies that are to be rejected (the interferer), they also provide finite impedance to the signal at frequencies that are to be passed.

The effectiveness of the series resonant circuit is dependent upon the strength with which it draws current from the signal path at its resonant frequency. High Q reactive components can contribute a certain extent to the effectiveness of the series resonant circuit, but these are typically expensive. For example, as described above, high-Q capacitors can be made using a metal-insulator-metal process rather than the less expensive metal-oxide-metal process. High-Q inductors generally need to be made from thicker metal and therefore, when fabricated as part of an on-chip circuit, a thicker more expensive metal layer (e.g., Cu/Al) is required. Regardless of whether or not high-Q components are used, the active circuit is used to change the amount of current drawn from the signal path at the resonant frequency of the series resonant circuit, so that the overall circuit is able to achieve a higher level of signal rejection from the signal path, and thus deepens the notch formed by the resonant circuit.

The signal that is received and passed along the signal path may be considered in simple terms as a desired signal (the signal that the filter should pass) and an interferer signal (the signal that the filter should reject). In practical applications each of these may in fact comprise multiple frequency components or frequency bands, but for simplicity in the following we will consider a single frequency interferer (e.g. one of the wireless LAN frequencies).

The active circuit is active in the sense that it draws power continuously (a constant DC current draw) whereas the other reactive components of the filter are passive components that simply shape the received signal. The active circuit acts as a voltage controlled current source which senses the voltage on the signal path and uses this sensed voltage to change the current draw through at least one of the reactive components of the series resonant circuit. The voltage on the signal path contains both the desired signal and the interferer (or unwanted signal). In an ideal implementation, the desired signal will have the same amplitude along the whole of the signal path while the magnitude of the interferer signal will degrade as it passes along the signal path. The point on the signal path at which the active circuit senses the voltage is preferably chosen so that there is a usable amount of the interferer signal still present at that point. As the series resonant circuit is designed to operate (resonate) at the frequency of the interferer, and as the drive (sensed voltage) for the active circuit comprises a usable amount of interferer signal, the active circuit will change the current flow through the series resonant circuit, by increasing or decreasing the current draw through the series resonant circuit in phase with the signal that is being shunted to ground through the series resonant circuit.

The signal (RF plus interferer) is sensed at the output. If the interferer component is higher in amplitude than the required SIR (signal-to-interference ratio), an active circuit (voltage controlled current source) measures the voltage along the signal path, and applies a current to the series resonant circuit, in order to reduce said interferer component. The signal is sensed at a node/terminal, such that the active device behaves as a linear, voltage-dependent current source realized with minimum power consumption.

In this regard, it should be noted that the phase of the signal at the node at which the active circuit senses the voltage relative to the phase of the signal at the node at which the series resonant circuit taps off the signal path is important. The active circuit should be designed either as an inverting or a non-inverting circuit to take account of any phase shift in its driving signal compared with the node of the series resonant circuit that it is affecting, so that the effect of the active circuit is to reduce the amplitude of the interferer signal at the node where the series resonant circuit is connected to the signal path.

If the SIR is higher than required, then the active circuit is preferably not enabled. If SIR is lower than specified, the active circuit can be enabled, and the point on the signal path which is used to drive the active circuit may be selected according to the particular circuit. Earlier in the signal path (closer to the input, e.g. the antenna) will have the strongest interferer signal which will require an active circuit with a high linearity in order to cope with this large unwanted signal. Thus, the signal is sensed at a node/terminal, such that the active circuit behaves as a linear, voltage-controlled current source realized consuming minimum power.

The active circuit may sense the voltage on the signal path upstream of where the series resonant circuit taps off the signal path. This would then be a feed-forward signal cancellation arrangement. Alternatively, the active circuit may sense the voltage on the signal path downstream of where the series resonant circuit taps off the signal path. This would then be a feed-back signal cancellation arrangement.

The filter may be any type of filter such as a low-pass or a band-pass filter for example, but in some preferred embodiments it is a high-pass filter. The main frequency response of the filter is determined by the other components that make up the filter. For example, a high pass filter may be formed from a chain of capacitors in the signal path while a low pass filter may be formed from a chain of inductors in the signal path. The series resonant circuit forms a notch in the frequency response of the filter at the resonant frequency of the series resonant circuit.

In the above discussions, connections to a ground are mentioned. It will be appreciated that this may be an analog ground (and in many cases, this is preferred), but it may also be a virtual or floating ground, particularly in the case of differential circuits where the positive and negative signals cancel each other out. For example, the positive and negative arm harmonic traps (series resonant circuits) in a differential implementation of this filter will cancel out creating a virtual ground at the axis of symmetry of the circuit.

The second reactive component may be a capacitive component of the series resonant circuit. However, in preferred embodiments the second reactive component is an inductive component. Where the first reactive component is an inductive component, the second reactive component is preferably a capacitive component.

Previous efforts to use active circuits for Q-enhancement of reactive components have been based around the "negative R" or "negative $g_m$," principle ($g_m$ being transconductance). In these arrangements inputs from the different arms of a differential circuit (i.e., out of phase inputs) are used to inject current onto the different arms of a differential circuit (i.e. out of phase outputs) in a positive feedback manner.

The signal path may comprise a plurality of reactive components. The order of the filter is the number of poles, realized by reactive components. Higher order filters with more reactive components improve the transfer function of said filter. In passive filters, these components may be inductive components or capacitive components. In preferred embodiments, the first reactive component is a capacitive component, i.e. constructing a high pass filter.

As described above, the active circuit may sense the voltage at a single point on the signal path, in which case it senses both the desired signal and the interferer signal. However, in preferred embodiments the active circuit senses the voltage across at least one reactive component on the signal path, thus sensing a voltage difference along the signal path. In other words, the active circuit may be driven by inputs taken from opposite sides of one or more signal path reactive components. The active circuit is preferably therefore arranged to change the current flow through the second reactive component in dependence on a voltage difference sensed across the first reactive component. By sensing the voltage drop across (at least) the first reactive component, the active circuit is only driven by the interferer signal as it is only the interferer signal that degrades along the signal path as a result of the harmonic resonant traps. The desired signal passes substantially unhindered along the signal path and will not contribute to the differential voltage that is sensed by the active circuit. This further enhances the efficiency of the active circuit by driving it only at the frequency of the interferer.

It will be appreciated that any form of LC filter may be used. However, as sharp roll-off is key to many applications (particularly wireless LAN rejection for UWB radio applications), the electronic circuit is preferably a fifth-order (or higher order) filter although it will be appreciated that the invention is not limited to a particular order of filter.

A single series resonant circuit (also referred to as a series single-tuned resonant circuit) forms a single harmonic trap that removes (sinks) the signal from the signal path at a single resonant frequency. In some preferred embodiments, the circuit further comprises: a second node on the signal path; a second series resonant circuit comprising at least a fourth reactive component in series with a fifth reactive component, the second resonant circuit being connected between the second node and the ground; and an active circuit comprising a voltage controlled current source arranged to change the current flow through the fourth reactive component in dependence on a voltage sensed on the signal path. Having two series resonant circuits each connected to a different node on the signal path forms a double harmonic trap filter. The two series resonant circuits may be arranged to operate at the same or substantially the same frequency to form a deep notch in the frequency response along the signal path. However, in other arrangements the two series resonant circuits may have different resonant frequencies, so as to provide two notches in the frequency response of the signal path. In other words, if the two series resonant circuits are designed with substantially the same resonant frequency then they will add together to form a higher rejection notch with sharper roll-off. Alternatively, the two series resonant circuits may have different resonant frequencies so that the frequency response has two notches. By moving the two notches closer together in the frequency domain, a highly effective (wider) stopband can be realized. The two notches are ideally placed sufficiently close together that the frequency band between the two notches remains below the rejection requirement of the circuit (e.g. below the rejection requirements of a filter).

The active circuit for the second series resonant circuit may be the same active circuit as for the first series resonant circuit or it may be a different (second) active circuit. The active circuit for the second series resonant circuit may sense the voltage on the signal path at the same point as the first active circuit or at a different point on the signal path. As with the first series resonant circuit, the most appropriate point to sense can be selected by considering the magnitude of the interferer signal that will be rejected by the second series resonant circuit and selecting a point on the signal path where that magnitude is within the linearity requirements of the active circuit.

The ground for the two series resonant circuits may be the same ground or it may be a different ground.

As described above (in relation to the first series resonant circuit), the fourth reactive component is preferably an inductive component. The fifth reactive component is preferably a capacitive component.

The circuit may further comprise a variable capacitor or capacitor bank connected between ground and a node between the second reactive component and the third reactive component. If a second resonant circuit is also provided, then a further variable capacitor or capacitor bank may also be connected between ground and a node between the fourth reactive component and the fifth reactive component. The variable capacitor(s) or capacitor bank(s) allow for tuning of the resonant frequency of the series resonant circuits by effectively varying the capacitance of the respective series resonant circuit to which the variable capacitor/capacitor bank is connected. This allows for trimming of the circuit to compensate for manufacturing tolerances and/or to tune the resonant frequency (or frequencies) of the circuit for one or more particular applications, thus increasing the versatility of the circuit.

The active circuit may comprise: a current source arranged to draw current through a first amplifying element, and thereby through the second reactive component, the first amplifying element being driven by the second node.

In the case of the double harmonic trap arrangement, with two series resonant circuits, the active circuit may enhance both series resonant circuits simultaneously.

The active circuit may be a differential amplifier comprising a first amplifying element and a second amplifying element and having an inverting output and a non-inverting output, wherein one of the outputs is used to drive the first series resonant circuit and the other output is used to drive the second series resonant circuit.

The signal path preferably comprises at least one reactive component between the first node and the second node, thereby separating the first series resonant circuit from the second series resonant circuit.

In particularly preferred arrangements the active circuit may sense the voltage difference across the first and second nodes (i.e. across the intervening reactive component), and applies its differential output current to the first and second series resonant circuits, preferably at the intersection point of the inductive component and the capacitive component of each of the two series resonance circuits.

For a higher order filter, the signal path may further comprise a sixth reactive component and a seventh reactive component in series with the first reactive component; and the first node may be located between the first reactive component and the sixth reactive component and the second node may be located between the sixth reactive component and the seventh reactive component. This arrangement will form a fifth order filter (or higher order if more elements are added).

In the case of the double harmonic trap discussed above, the current source of the active circuit is further arranged to draw current through a second amplifying element and thereby through the fourth reactive component, the second amplifying element being driven by the first node.

As discussed above, the active circuit is preferably a differential common-source amplifier. The first and second amplifying elements of the differential common-source amplifier may be FETs, each being driven by the voltage at its respective gate and with a respective current source (or a common current source) being connected to its source.

The active circuit may be applied to reactive components of one or more series resonant circuits in a single-ended circuit. However, the circuit arrangement is particularly advantageous when applied to differential circuits, particularly because the symmetry forms an AC ground between the positive signal arm and the negative signal arm so that the series resonant circuit of one arm (e.g. the positive arm) works in conjunction with the corresponding series resonant circuit of the other arm (e.g. the negative arm).

Therefore, according to another aspect of the invention, there is provided a differential circuit having a first positive arm and a second negative arm; wherein the first positive arm is a circuit as described above, and wherein the second negative arm is a circuit as described above, and wherein the first series resonant circuit of the first positive arm and the first series resonant circuit of the second negative arm are connected together to form an AC ground.

It will be appreciated that the circuit arms of the differential circuit may be any of the forms discussed above, optionally including any of the optional or preferred features also described above. It will be appreciated that where each signal arm (positive and negative) also comprises a second series resonant circuit to form a double harmonic trap, the second series resonant circuits are also connected together to form the AC ground.

In the case of differential circuits, series resonant circuits of opposite signal arms each have an inductive component. While these may be separate, individual inductive components, in preferred embodiments the first positive arm is connected to the second positive arm by a centre-tapped inductor with the AC ground formed at its centre tap, and wherein the centre-tapped inductor forms part of the first series resonant circuits of the first positive arm and the second negative arm. The use of a single centre-tapped inductor to provide the inductive components of both first series resonant circuits allows further area saving and corresponding cost saving by allowing a single coil or winding to provide both inductive elements. It will be appreciated that a centre-tapped inductor may be used for second (or further) series resonant circuits in the same manner. The centre-tapped inductors are preferably symmetrically tapped such that the two halves of the centre-tapped inductor have substantially the same inductance.

According to another aspect of the invention, there is provided a method of filtering a signal comprising: passing the signal along a signal path from an input to an output through a first reactive component; from a first node on the signal path, shorting the signal to ground through a first series resonant circuit at the resonant frequency of the first series resonant circuit, the first series resonant circuit comprising a second reactive component in series with a third reactive component; and using an active circuit comprising a voltage controlled current source to draw current through the second reactive component, the active circuit changing the current flow through the second reactive component in dependence on a voltage sensed on the signal path.

It will be appreciated that all of the preferred features described above in relation to the circuit can also be applied to the method of filtering.

Certain preferred embodiments of the invention will now be described, by way of example only, and with reference to the accompanying drawings in which:

FIG. 2 illustrates a fifth order high pass filter;

FIG. 3 illustrates a series resonant circuit;

FIG. 4 illustrates a single-harmonic trap filter arrangement;

Figure 1:
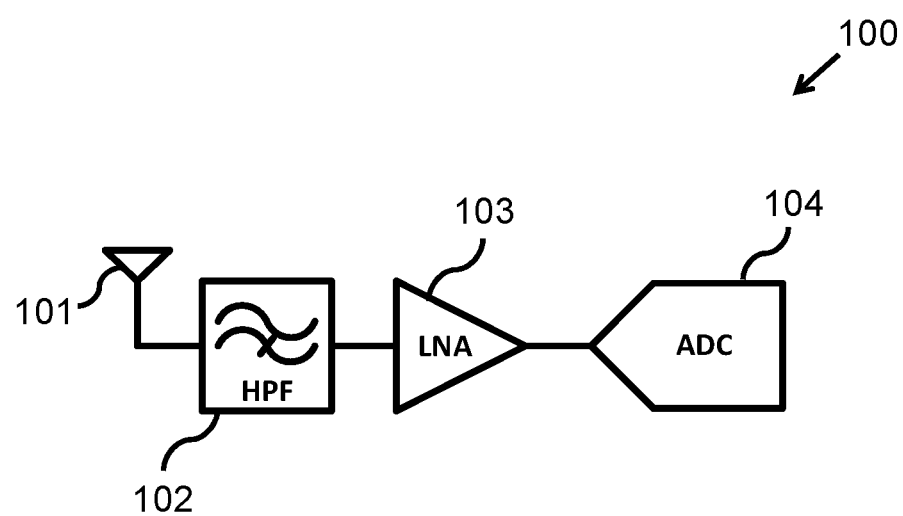
FIG. 1 illustrates a typical direct sampling receiver front-end.

FIG. 1 depicts a typical direct sampling receiver front-end 100 for a wideband receiver operating for example in the 6 to 8.5 GHz band. Antenna 101 receives a RF signal and passes it to high-pass filter 102 which rejects signals below about 6 GHz, with a high rejection notch at around 5.1 to 5.8 GHz (although it will be appreciated that these numbers are provided purely by way of example). The output of high-pass filter 102 feeds to the input of low-noise amplifier 103 which provides gain for the signal of interest across the operating band of 6 to 8.5 GHz.

The output of low-noise amplifier 103 is then fed to an analog-to-digital converter (ADC) 104 that finally digitises the RF signal.

FIG. 2. shows a basic fifth order high pass LC-ladder filter 200. The (forward) signal path runs from $RF_i$ to $RF_o$. For example, an antenna may be connected to $RF_i$ and the filtered signal from $RF_o$ may be fed to further processing circuits. The filter 200 has three capacitors $C_1$, $C_2$, $C_3$ in the signal path and two inductors $L_1$, $L_2$ connecting the signal path to ground. The reactance values of $C_1$, $C_2$, $C_3$, $L_1$ and $L_2$ determine the properties of the filter such as its order, cut-off frequency, stopband frequency, and stopband rejection.

FIG. 3 shows a basic series resonant circuit 300 connecting a node A to ground through an inductor $L_1$ in series with a capacitor $C_1$. At the resonant frequency ($1/(2\pi(L_1C_1)^{1/2})$) the inductor ($X_L$) and capacitor ($X_C$) reactances cancel out (i.e., $X_L-X_C=0$), so that the series resonant circuit 300 forms a short circuit to ground at that frequency (i.e., the circuit impedance is minimum and entirely resistive). Moreover, at resonance, the voltage across the capacitor ($V_C$) is equal to, but in anti-phase to the voltage across the inductor ($V_L$), and the circuit current is at maximum. Below the resonance, the circuit is capacitive ($X_C>X_L$), and above the resonance, the circuit is inductive ($X_L>X_C$).

FIG. 4 shows a basic single-harmonic trap (SHT) filter 400 having a signal path from $RF_i$ to $RF_o$ and with the series resonant circuit 300 of FIG. 3 connected at node A at $RF_o$. The HPF function comprises capacitor $C_2$ in the signal path and inductor $L_1$. Capacitor $C_2$ is the only reactive component in the signal path, i.e., between the signal input, $RF_i$ and the signal output, $RF_o$. Therefore, in the passband $C_2$ provides the direct impedance seen by the signal passing along the signal path. By appropriate selection of $L_1$ and $C_1$, the resonant frequency of these two reactive components can be used to form a notch in the transfer function (at the resonant frequency) by providing a short circuit/low impedance path to ground (at that resonant frequency). With $C_1$ resonating with $L_1$ (in the stopband), said filter is a SHT HPF. Frequency components of the input signal at the resonant frequency at node A or output will see a short circuit to ground, and therefore current can flow to ground at this resonant frequency and the amplitude of the output signal at this resonant frequency will be greatly diminished. At other frequencies (either side of the resonant frequency of the series resonant circuit) the signal will see an impedance between the signal path and ground and therefore the signal at these frequencies will be significantly less reduced in amplitude and instead passes to the signal path output $RF_o$.

Figures 5A, 5B:
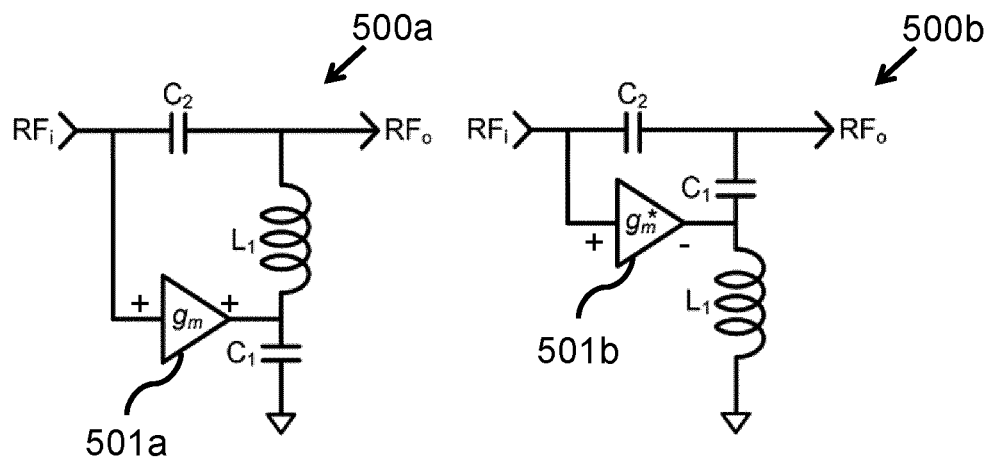
FIGS. 5a and 5b show embodiments of a single-harmonic trap filter with active circuit.

FIGS. 5a and 5b show the use of an active circuit to further mitigate the unwanted signal (the interferer). The filters 500a and 500b in FIG. 5a and FIG. 5b have active circuits 501a and 501b (labelled "$g_m$ and $g_m$*" in the figures) that sense the signal on the signal path upstream of the capacitor $C_2$ (i.e. between $RF_i$ and $C_2$). The active circuit 501a, 501b draws a constant dc current through the inductor $L_1$, but varies the magnitude of this current based on the sensed voltage on the signal path upstream of $C_2$. As the signal upstream of $C_2$ contains both the wanted signal (the signal to be passed by the filter) and the interferer (the signal to be rejected by the filter), the active circuit 501a, 501b varies the current in part based on the magnitude of the interferer and applies it to the node between $L_1$ and $C_1$. As the magnitude of the current is thereby increased at the resonant frequency, the amount of unwanted signal that is tapped off from the signal path is increased. Thus, the effectiveness of the series resonant circuit is increased by the active circuit so that the overall removal of the unwanted signal (interferer) by the filter 500a, 500b is improved.

Care needs to be taken to ensure that the active circuits 501a, 501b operate in phase with the node at which the series resonant circuit is connected so as to enhance the signal removal, i.e. the filter effectiveness. This will depend on the phase of the signal at which the active circuits 501a, 501b sense or measure the voltage on the signal path and the order of the reactive components in the series resonant circuit. FIG. 5a shows the case where the signal is sensed upstream of a capacitor $C_2$ and where the inductor $L_1$ is connected directly to the signal path while the capacitor $C_1$ connects to ground. The active circuit 501a is connected to the node between the inductor $L_1$ and the capacitor $C_1$. At resonance, there is a phase change of approximately 180 degrees across $C_2$, and also a phase change of approximately 180 degrees across $L_1$. Therefore the phase at the node where the active circuit 501a is connected is inphase with the node at which the active circuit senses the signal path. Thus, the active circuit 501a in FIG. 5a is a non-inverting active circuit (denoted by the '+' at its input and the '+' at its output) such that its output is non-inverted with respect to its input. FIG. 5b shows the opposite situation in which the capacitor $C_1$ is connected directly to the signal path while the inductor $L_1$ connects to ground. Here there is a 180-degree phase change between the node where the active circuit 501b is connected to the series resonant circuit and the node at which the active circuit senses the signal path. Therefore in FIG. 5b the active circuit 501b is an inverting active circuit (denoted by the '+' at its input and the '−' at its output, and the label $g_m$*) such that its output is inverted with respect to its input to compensate for this phase change.

Figures 6A, 6B:
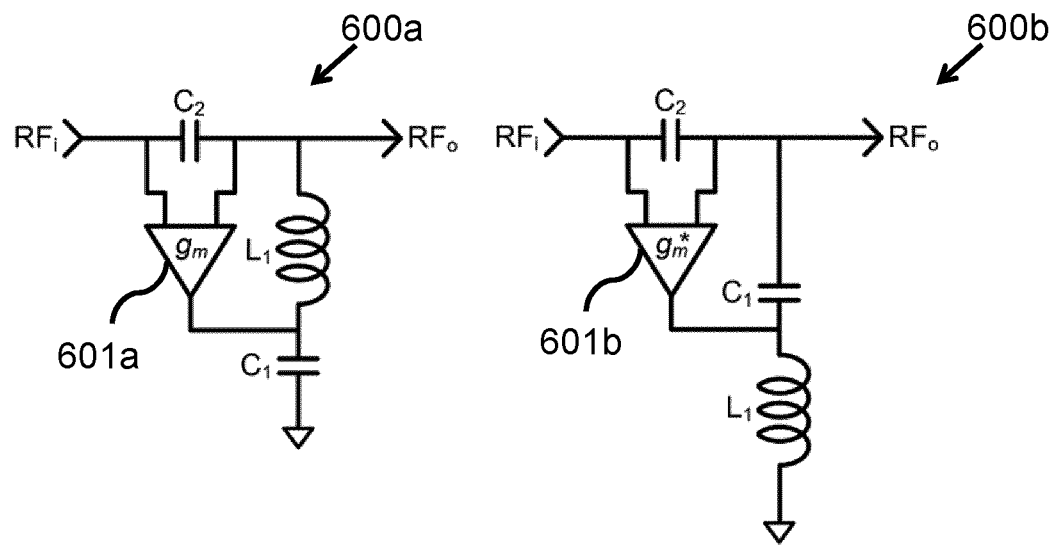
FIGS. 6a and 6b show embodiments of a single-harmonic trap filter with active circuit driven by a voltage difference on the signal path.

FIGS. 6a and 6b are similar to FIGS. 5a and 5b except that instead of the active circuits 601a, 601b merely sensing the voltage on the signal path it senses the voltage drop across a reactive component on the signal path (in this case the capacitor $C_2$). As the capacitor $C_2$ can be chosen to provide an impedance at the frequency of the unwanted (interferer) signal, the amplitude of the interferer will drop across the capacitor $C_2$ while the amplitude of the desired signal does not drop (or at least drops significantly less). Thus, as the active circuits 601a, 601b are driven by a difference signal which is predominantly at the frequency of the interferer, the active circuits 601a, 601b control the current draw through the series resonant circuit in relation to the interferer without any significant component of other frequencies such as those of the desired signal. This makes for a more efficient active circuit, thus further reducing the amplitude of the unwanted signal on the signal path. As with FIGS. 5a and 5b, FIG. 6a shows a non-inverting active circuit 601a ($g_m$) acting on a series resonant circuit with the inductor $L_1$ connected directly to the signal path, while FIG. 6b shows an inverting active circuit 601b ($g_m$*) acting on a series resonant circuit with the capacitor $C_1$ connected directly to the signal path.

Figure 7:
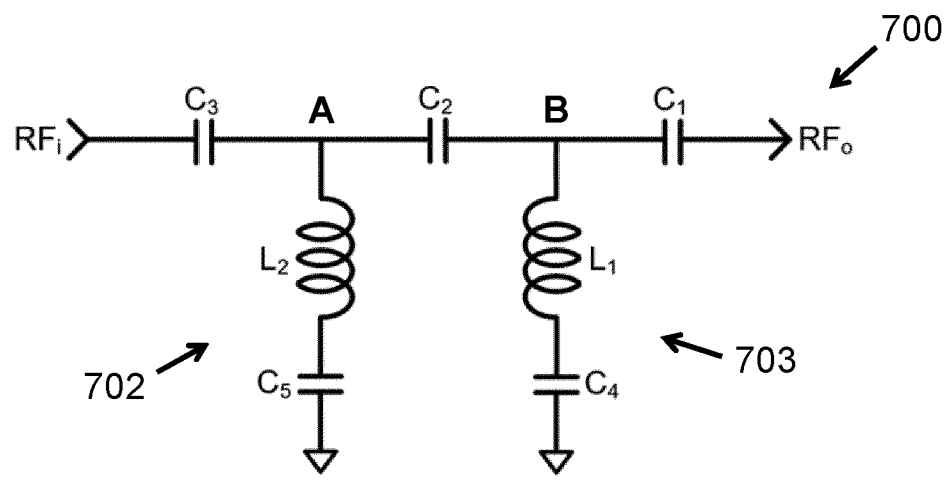
FIG. 7 shows a high pass filter with two series resonant circuits.

FIG. 7 shows a $5^{th}$ order LC ladder high pass filter 700 with two series resonant circuits tapping off from the signal path. The signal path from $RF_i$ to $RF_o$ has three capacitive components $C_3$, $C_2$, $C_1$ with a first node formed between the first two capacitive components (node A between $C_3$ and $C_2$) and a second node formed between the last two capacitive components (node B between $C_2$ and $C_1$). A first series resonant circuit 702 is connected between node A and ground and is formed from inductive component $L_2$ and capacitive component $C_5$. A second series resonant circuit 703 is connected between node B and ground and is formed from inductive component $L_1$ and capacitive component $C_4$. No active circuits are shown in this arrangement for simplicity, but they can be connected as shown in FIG. 5a or 6a so as to increase the signal reduction at resonance as discussed above. It will be appreciated that this filter architecture can readily be extended to higher order filters by adding further inductive components and capacitive components as per the usual structure of LC ladder filters. Further series resonant circuits could also be added if desired, although it is not essential to provide a series resonant circuit at every intermediate node of the filter. Indeed, the architecture of FIG. 7 could have only one of the series resonant circuits ($L_2/C_5$ or $L_1/C_4$) and still provide an improved filtered signal at $RF_o$. It will also be appreciated that the first series resonant circuit 702 and the second series resonant circuit 703 may have different resonant frequencies so as to provide two notches in the filter output at $RF_o$ or they may have the same resonant frequency to provide a single deep notch in the filter output at $RF_o$.

Figure 8:
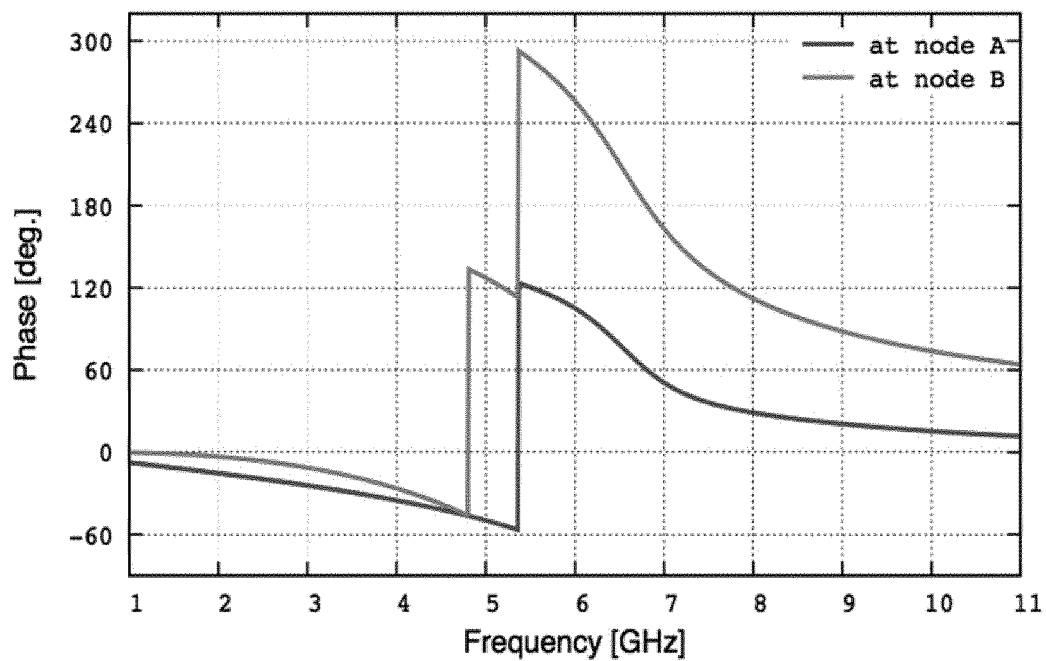
FIG. 8 is a graph showing the phase of signals at nodes A and B of FIG. 7.

FIG. 8 shows the phase of signals at nodes A and B of the filter 700 of FIG. 7 across a range of frequencies. At node A, it can be seen that the phase of the signal undergoes an approximately 180-degree phase shift at around 5.3 GHz, this being the resonant frequency of the first series resonant circuit 702 ($L_2/C_5$) attached at node A. At node B, it can be seen that the phase of the signal undergoes an approximately 180-degree phase shift at around 4.8 GHz, this being the resonant frequency of the second series resonant circuit 703 ($L_1/C_4$) attached at node B. A further phase shift occurs at 5.3 GHz (i.e. the resonant frequency of the first series resonant circuit 702) due to the effect of the first series resonant circuit 702 at node A.

Figure 9:
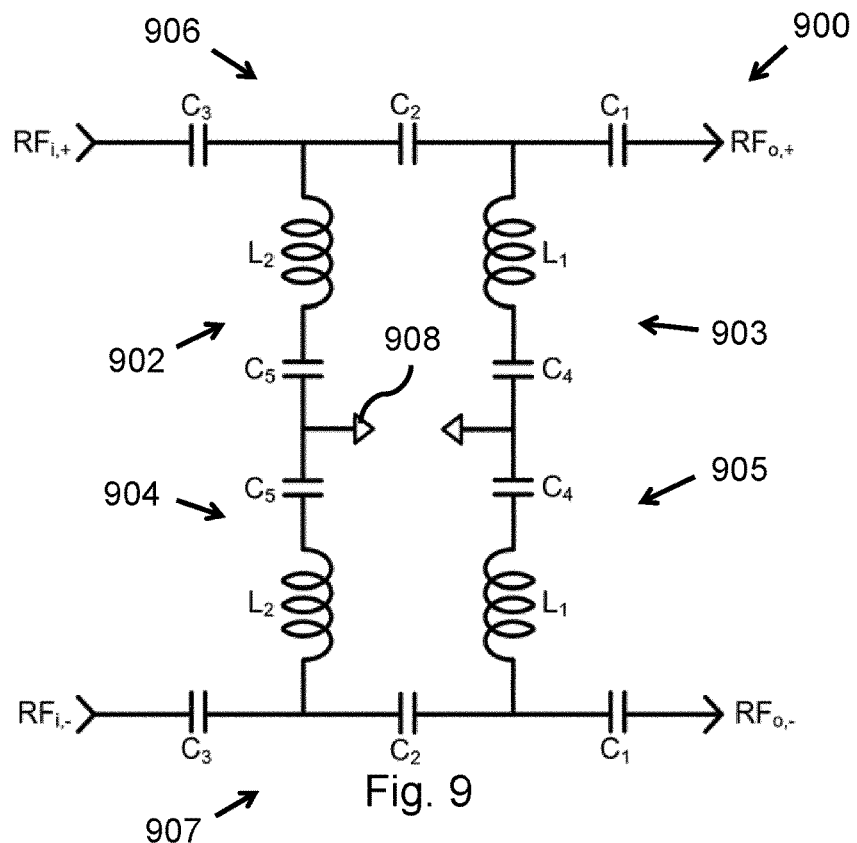
FIG. 9 shows a differential form of the filter of FIG. 7.

FIG. 9 shows a differential filter circuit 900, this being a differential form of the circuit 700 of FIG. 7. The differential circuit 900 has a positive arm 906 including a positive signal path from $RF_{i,+}$ to $RF_{o,+}$ and a negative arm 907 including a negative signal path from $RF_{i,-}$ to $RF_{o,-}$. The positive arm 906 and the negative arm 907 are identical and are connected together via their respective series resonant circuits 902, 904 and 903, 905 to form a virtual ground 908 between them at the point of connection (i.e. symmetrically between the two signal paths). The virtual ground 908 may be connected to an analog ground if desired or it may be left as a floating ground. As can be seen in FIG. 9, the first series resonant circuit 902 of the positive signal arm 906 is connected to the first series resonant circuit 904 of the negative signal arm 907. Similarly, the second series resonant circuit 903 of the positive signal arm 906 is connected to the second series resonant circuit 905 of the negative signal arm 907. Again, no active circuits are shown here for simplicity, but they can readily be added as discussed below.

Figure 10:
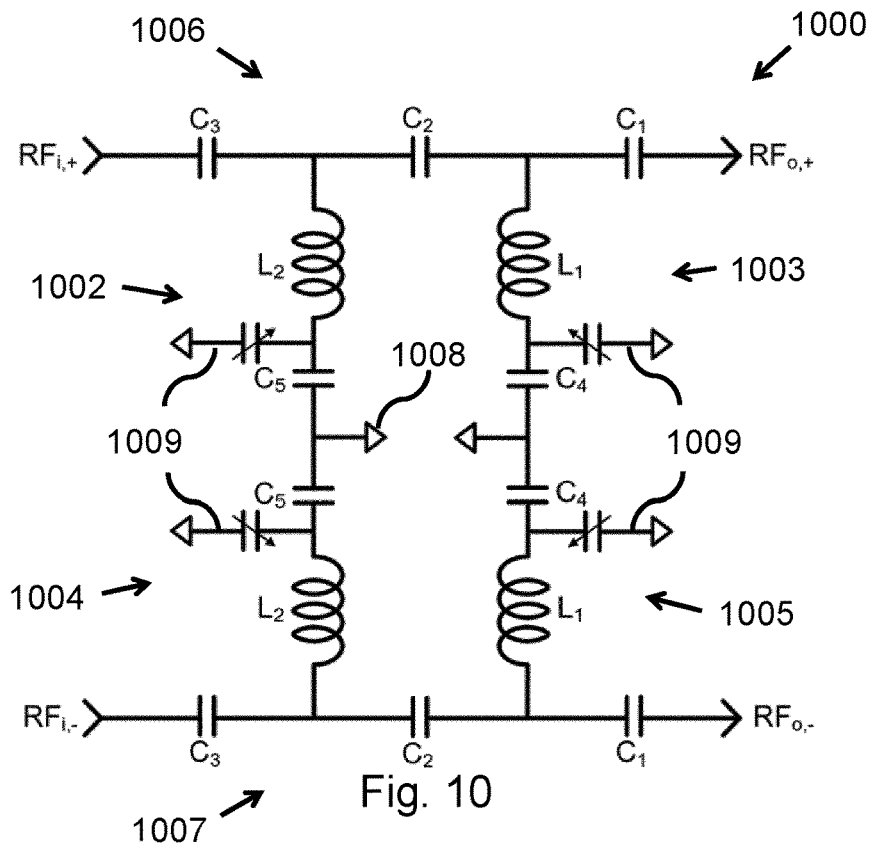
FIG. 10 shows another differential filter with tunability.

FIG. 10 shows another differential filter circuit 1000 similar to that of FIG. 9, but with the addition of variable capacitors 1009 connected in parallel with each of the capacitive elements $C_4$, $C_5$ of the first and second series resonant circuits 1002, 1003, 1004, 1005 (of both the positive and negative signal arms 1006, 1007).

These variable capacitors 1009 provide for tuning of the first and second series resonant circuits 1002, 1003, 1004, 1005 so as to adjust the resonant frequencies and thereby adjust the frequency of the notch in the filter output $RF_{o,+}$, $RF_{o,-}$. The variable capacitors 1009 may be switchable capacitor banks in some examples, or may be continuously variable capacitors in other examples.

Figure 11:
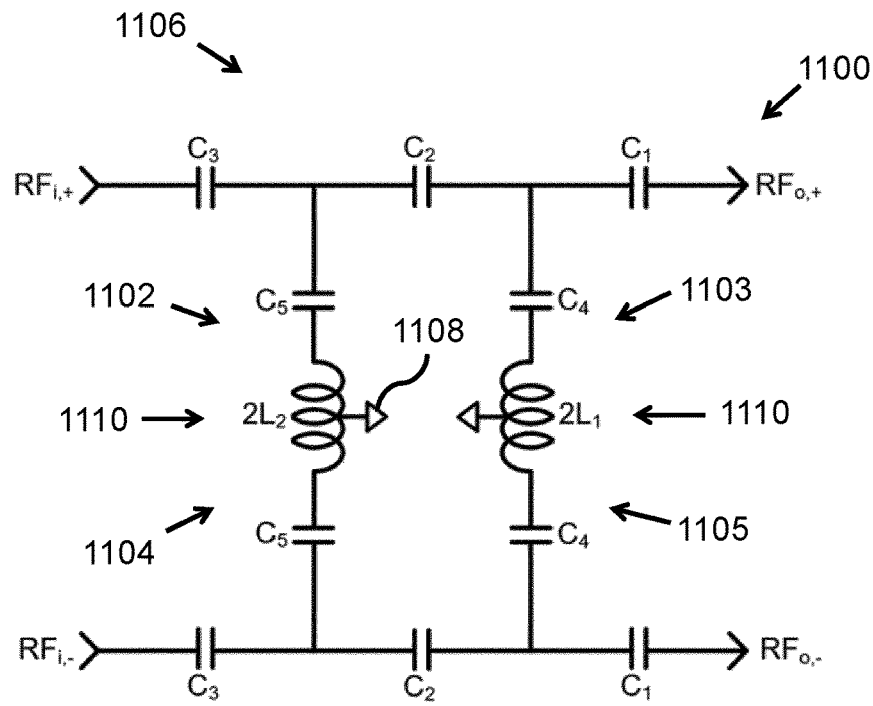
FIG. 11 shows a differential filter using centre-tapped inductors.

FIG. 11 is similar to FIG. 9, but shows a further improvement that can be made in differential embodiments. In this example, the differential filter 1100 has the capacitors $C_4$, $C_5$ of the series resonant circuits 1102, 1103, 1104, 1105 connected directly to the respective signal paths and combines the inductors $L_1$, $L_2$ of the series resonant circuits 1102, 1103, 1104, 1105 into centre-tapped inductors 1110. For example, the inductive element of the first series resonant circuit 1102 of the positive signal arm 1106 and the inductive element of the first series resonant circuit 1104 of the negative signal arm 1107 are combined into a single centre-tapped inductor 1110 with inductance of $2L_2$. Similarly, the inductors of the second resonant circuits 1103, 1105 (positive and negative) are combined into a single centre-tapped inductor 1110 with inductance $2L_1$. The use of centre-tapped inductors 1110 reduces the die area required for the circuit when fabricated on chip.

Figure 12:
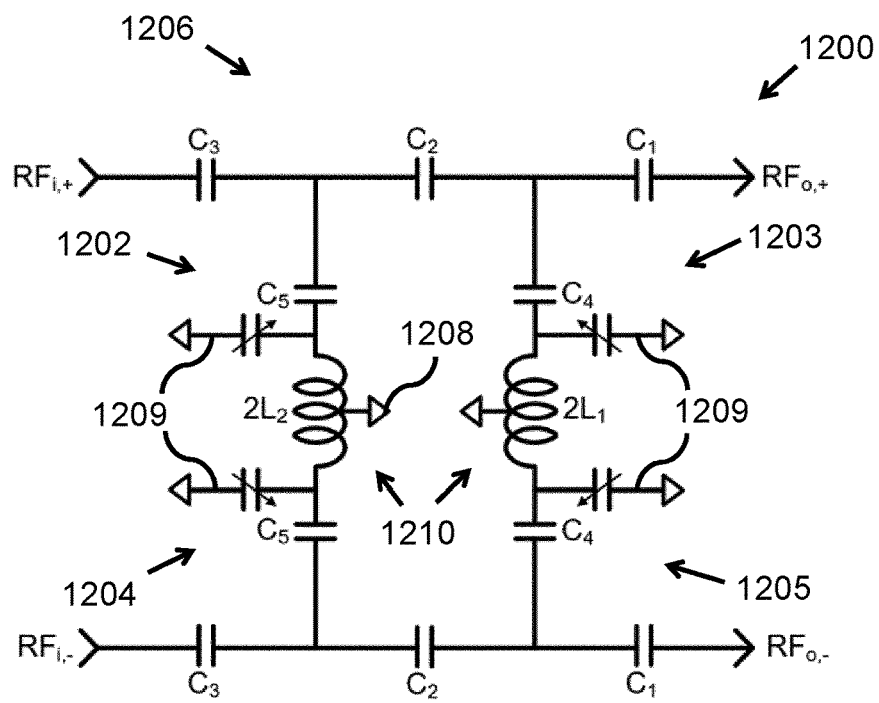
FIG. 12 shows a differential filter with tenability, using centre-tapped inductors.

FIG. 12 shows a differential circuit 1200 with centre-tapped inductors 1210 like that of FIG. 11 and also with variable capacitors 1209 as in FIG. 10. Again, no active circuits are shown in FIG. 11 or 12 for clarity but can easily be added as discussed below.

Figure 13A:
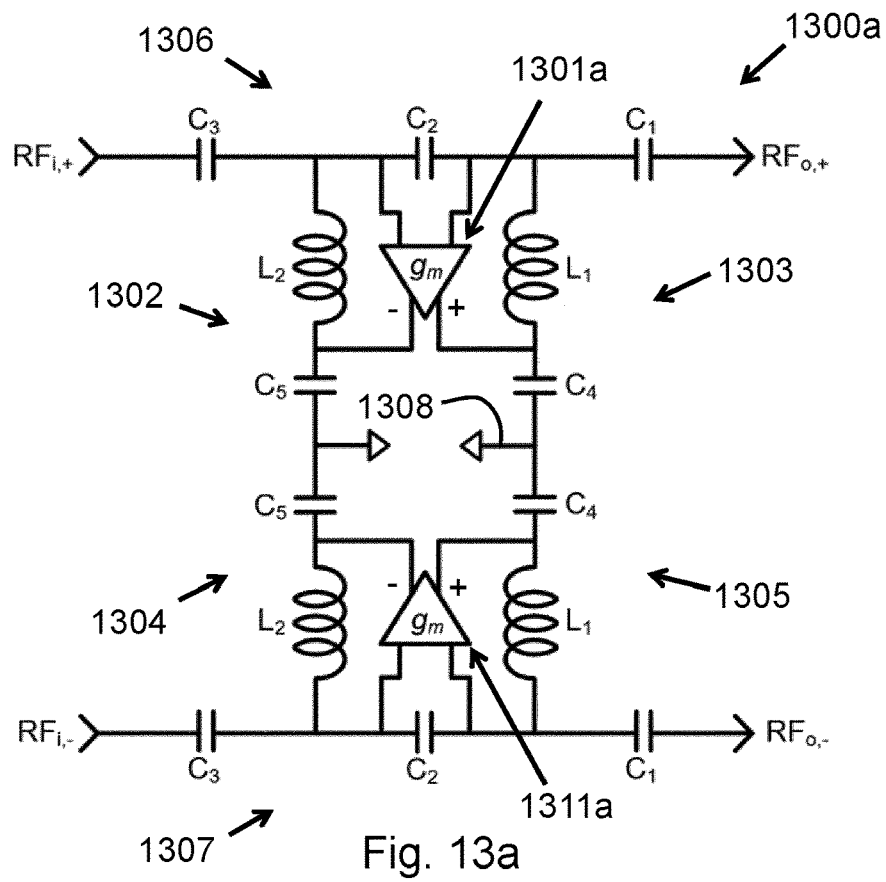
FIGS. 13a and 13b show how to connect active circuits to differential filters.

FIG. 13a shows the differential circuit 1300a similar to that of FIG. 9, but with active circuits 1301a, 1311a added. The active circuit 1301a on the positive signal arm 1306 of the differential circuit 1300 is connected with its input taken across the second capacitor $C_2$ on the signal path. As described above in relation to FIGS. 6a and 6b, taking the difference signal across a reactive element of the signal path means that the active circuit 1301a is driven predominantly by the interferer signal as that experiences the greatest amplitude reduction across the reactive element. In FIG. 13a the active circuit 1301a of the positive signal arm 1306 is configured to have a differential output with one output driving the first series resonant circuit 1302 of the positive signal arm 1306 and the other output driving the second series resonant circuit 1303 of the positive signal arm 1306.

As the interferer degrades downstream, the second resonant circuit 1303 will be primarily affected. It is thus appropriate in this arrangement to have the first series resonant circuit 1302 formed by $L_2$ and $C_5$ driven by an inverting output (indicated by "−") of the active circuit 1301a and the second series resonant circuit 1303 formed by $L_1$ and $C_4$ driven by a non-inverting output (indicated by "+") of the active circuit 1301a. With this arrangement, the first series resonant circuit 1302 is driven in a feedback arrangement and the second series resonant circuit 1303 is driven in a feedforward arrangement. It may be noted that the feedback arrangement shown in FIG. 13a with the inverting output of active circuit 1301a actually adds a small amount of interferer signal back onto the signal path. However, with the active circuit 1301a designed for the feedforward interferer removal through the second series resonant circuit 1303, the amount added back on at the first series resonant circuit is insignificant. To remove signal from the first series resonant circuit 1302 as well as from the second series resonant circuit 1303, the active circuit 1301a would need to provide a second non-inverting output. However, it is more convenient from a circuit perspective to use a differential active circuit 1301a with one inverting output and one non-inverting output. The inverting ("−") output from the active circuit 1301a could be connected to an ac ground or to Vdd in order to avoid adding unwanted signal back onto the first series resonant circuit 1302. However, connecting the inverting output to the first series resonant circuit 1302 has an insignificant impact on the performance of the whole circuit and there is a significant advantage in terms of load balancing by connecting the inverting and non-inverting outputs of the differential active circuit 1301a each to a series resonant circuit. The same arrangement is shown with the active circuit 1311a driving the first series resonant circuit 1304 and second series resonant circuit 1305 of the negative signal arm 1307. It will be appreciated that in other examples, if the phases are different, or if the active circuit 1301a, 1311a senses the signal on the signal path at other points along the signal path, the phases may be different. Also, more than one active circuit 1301a, 1311a may be used to drive the two series resonant circuits 1302, 1303 or 1304, 1305. In each case the phases should be considered, and the active circuit 1301a, 1311a appropriately chosen so as to drive the series resonant circuits 1302, 1303, 1304, 1305 appropriately.

Figure 13B:
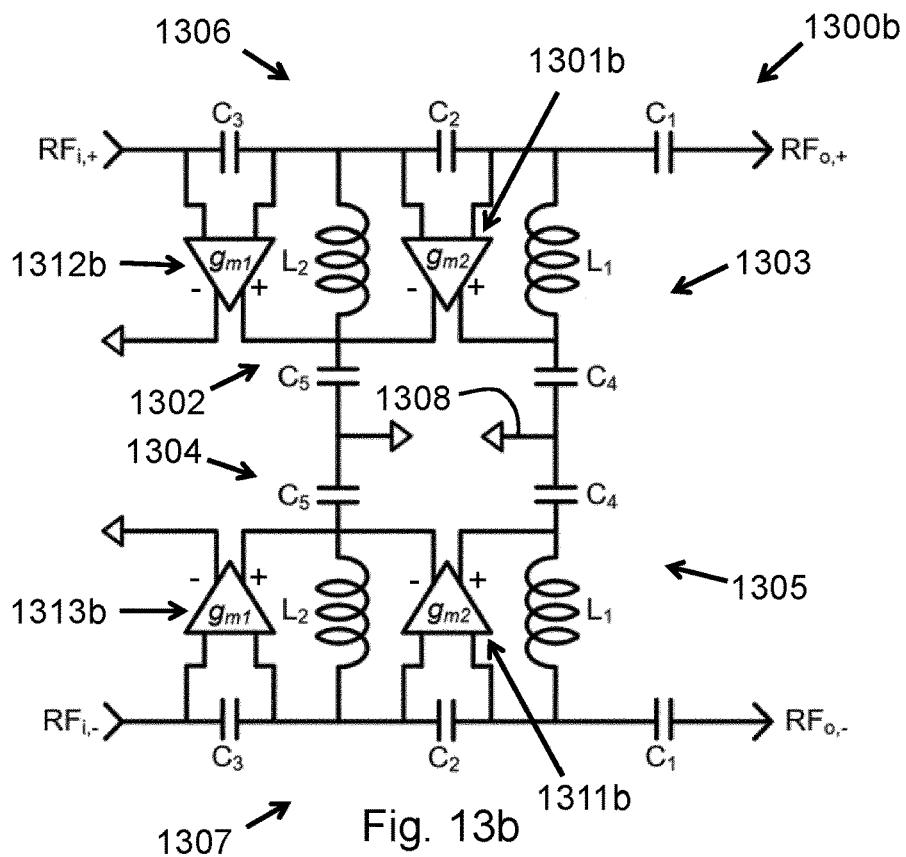

FIG. 13b shows the differential circuit 1300b similar to that of FIG. 13a, but with active circuits 1312b, 1313b added. The active circuit 1312b on the positive signal arm 1306 of the differential circuit 1300b is connected with its input taken across the second capacitor $C_3$ on the signal path. As described above in relation to FIGS. 6a and 6b, taking the difference signal across a reactive element of the signal path means that the active circuit 1312b is driven predominantly by the interferer signal as that experiences the greatest amplitude reduction across the reactive element. The active circuit 1312b of the positive signal arm 1306 is configured to have a differential output with one output driving the first series resonant circuit 1302 of the positive signal arm 1306 and the other output not connected (connected to ground). The same arrangement is shown on the negative signal arm 1307 with the active circuit 1313b configured to have a differential output with one output driving the first series resonant circuit 1304 of the negative signal arm 1307 and the other output not connected (connected to ground).

As in FIG. 13a, it is thus appropriate in this arrangement to have the first series resonant circuit 1302 formed by $L_2$ and $C_5$ driven by a non-inverting output ("+") of the active circuit 1312b and the second series resonant circuit 1303 formed by $L_1$ and $C_4$ driven by a non-inverting output ("+") of the active circuit 1301b. As was discussed above with reference to FIG. 13a, the inverting output ("−") of the active circuit 1301a is non-ideal from the perspective of removing the interferer signal, but the effect is minimal, while the load balancing advantages are significant. In the arrangement of FIG. 13b, the non-inverting output of the active circuit 1312b dominates over the inverting output of the active circuit 1301b, i.e. $gm_1$ has much more effect at this node than $gm_2$. In alternative embodiments (e.g. where there is no load balancing issue), the inverting output of active circuit 1301b could be connected to ground or Vdd instead.

It will be appreciated that in other examples, if the phases are different, or if the active circuit 1301b, 1311b, 1312b, 1313b senses the signal on the signal path at other points along the signal path, the phases may be different. Also, more than one active circuit may be used to drive the two series resonant circuits 1302, 1303 or 1304, 1305. In each case the phases should be considered, and the active circuit 1301b, 1312b appropriately chosen so as to drive the series resonant circuit 1302, 1303 appropriately. The active circuits 1311b, 1313b for the negative signal arm 1307 operate in exactly the same manner as the active circuits 1301b, 1312b for the positive signal arm 1306.

Figure 14:
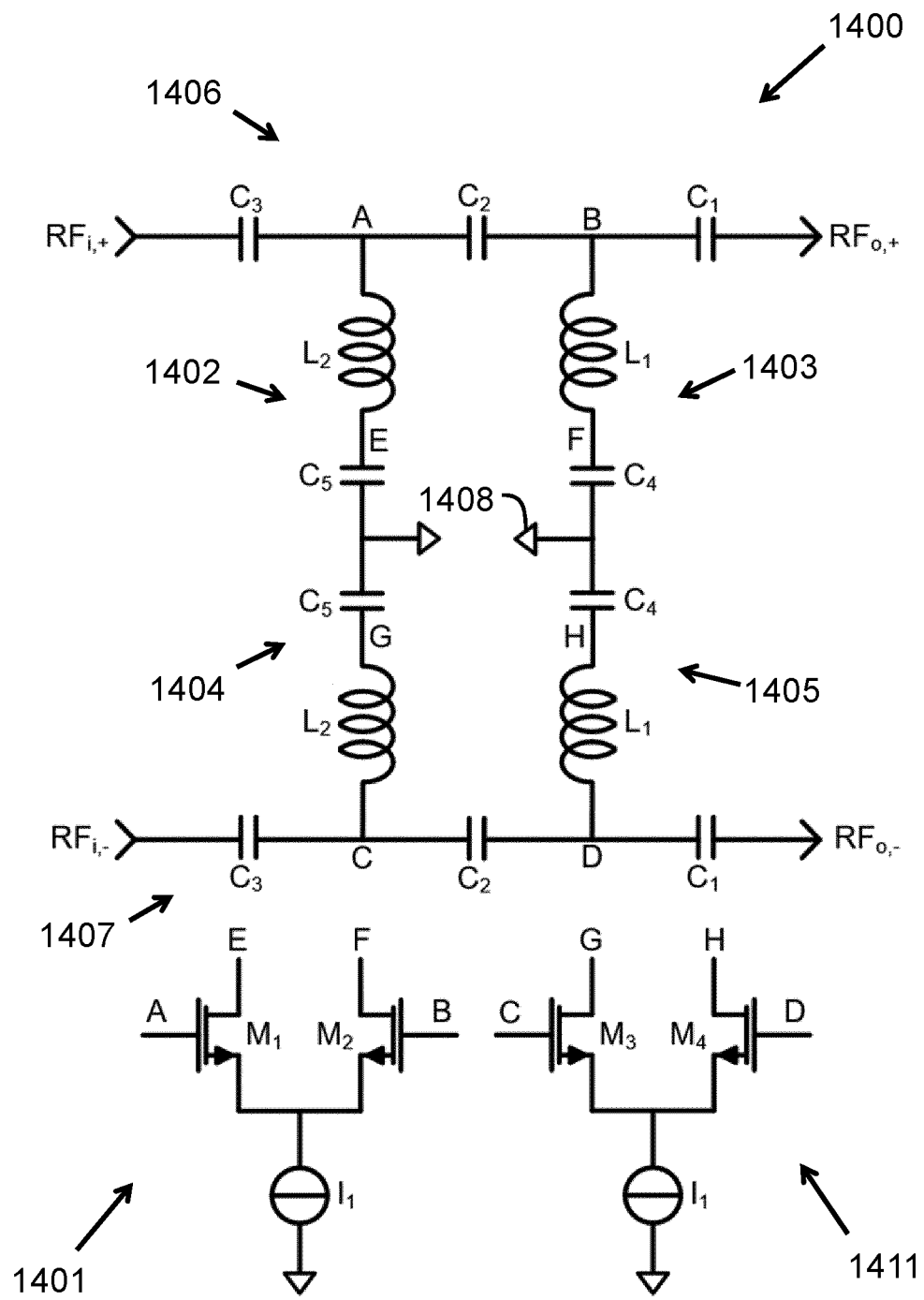
FIG. 14 shows the active circuits of FIGS. 13a and 13b in more detail.

FIG. 14 is similar to FIG. 13a, but illustrates a filter 1400 with one particular embodiment of the active circuits 1401, 1411. In this case, each active circuit 1401, 1411 is arranged as a differential amplifier comprising two amplifier elements (e.g. FETs) $M_1$, $M_2$ and $M_3$, $M_4$, respectively. The amplifier elements $M_1$, $M_2$ in 1401 are connected to a current source $I_1$ and are driven (through connections to their gates) from nodes A and B as illustrated. The amplifier outputs (the drains of $M_1$, $M_2$) are connected to the series resonant circuits 1402, 1403 at nodes E and F which in this example are the nodes at the intersection of the inductive element and the capacitive element of the respective series resonant circuit 1402, 1403. The gates of amplifier elements $M_3$, $M_4$ in the active circuit 1411 of the negative signal arm 1407 are driven by nodes C and D on the negative signal path and with the drains of $M_3$, $M_4$ connected to nodes G and H being the intersections of the inductive element and the capacitive element on each of the first and second series resonant circuits 1404, 1405 of the negative signal arm 1407.

The required $g_m$ is proportional to the interferer strength. As the signal plus interferer propagates from left to right, the chosen value of $g_m$ (small) really only affects the interference signal (small) at the output. Nonetheless, it is still preferable to load each half of the differential amplifier with the same/similar load, and that is why the drain of $M_1$ is connected to node E.

With this arrangement, the active circuits 1401, 1411 provide feed-forward cancellation to the second series resonant circuit 1403, 1405 on each signal arm. As the active circuits 1401, 1411 sense the signal across a reactive component on the signal arm, the active circuits 1401, 1411 are driven by a low input (approximately 0 V) for the signal of interest (the signal that is to be passed by the filter 1400) and is driven by a high input (the voltage drop across the reactive component) for the interferer signal (that is to be rejected by the filter 1400). Away from the resonant frequencies of the series resonant circuits 1402, 1403, 1404, 1405, the series resonant circuits 1402, 1403, 1404, 1405 have little impact on the signal path, and thus, the filter 1400 has low insertion loss. At (or close to) the resonant frequencies of the series resonant circuits 1402, 1403, 1404, 1405 the series resonant circuits themselves provide a short to ground that removes unwanted signal components from the signal path and the active circuit 1401, 1411 enhances these series resonant circuits 1402, 1403, 1404, 1405 further to increase the removal of said unwanted signal components.

Figure 15:
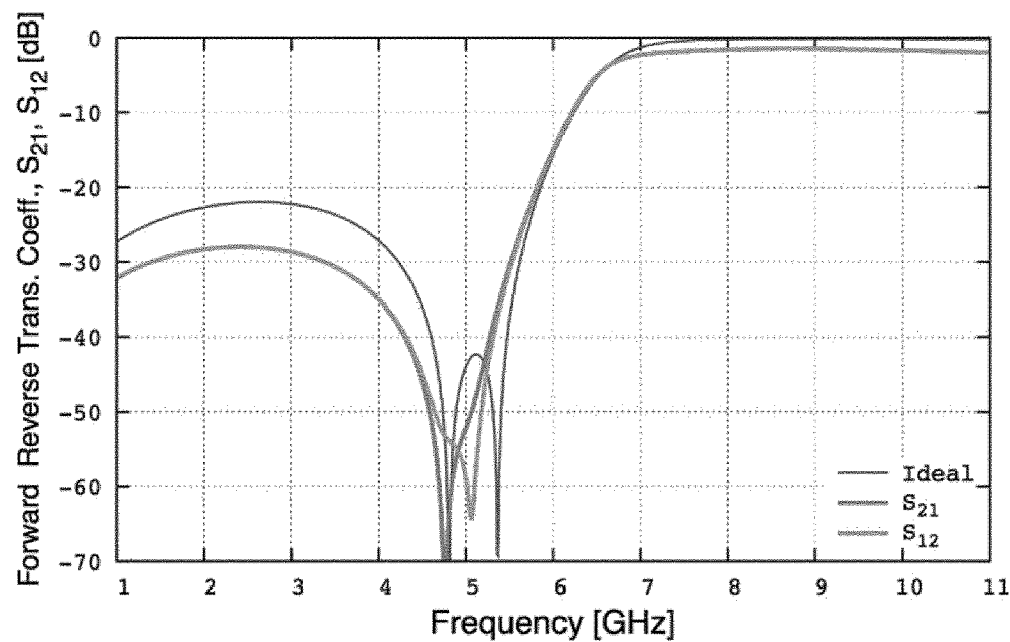
FIG. 15 is a graph of forward and reverse transmission coefficients for a filter according to FIG. 14.

FIG. 15 shows the frequency response (forward transmission coefficient, $S_{21}$) of the filter circuit 1400 of FIG. 14 with the series resonant circuits tuned to approximately 4.8 GHz and 5.3 GHz. The ideal filter response is shown in which two distinct notches in the filter response are visible, one at each resonant frequency. The notches are sufficiently close together that they essentially form a single wide-band notch. FIG. 15 also shows the reverse transmission coefficient, $S_{12}$ in dB.

Figure 16:
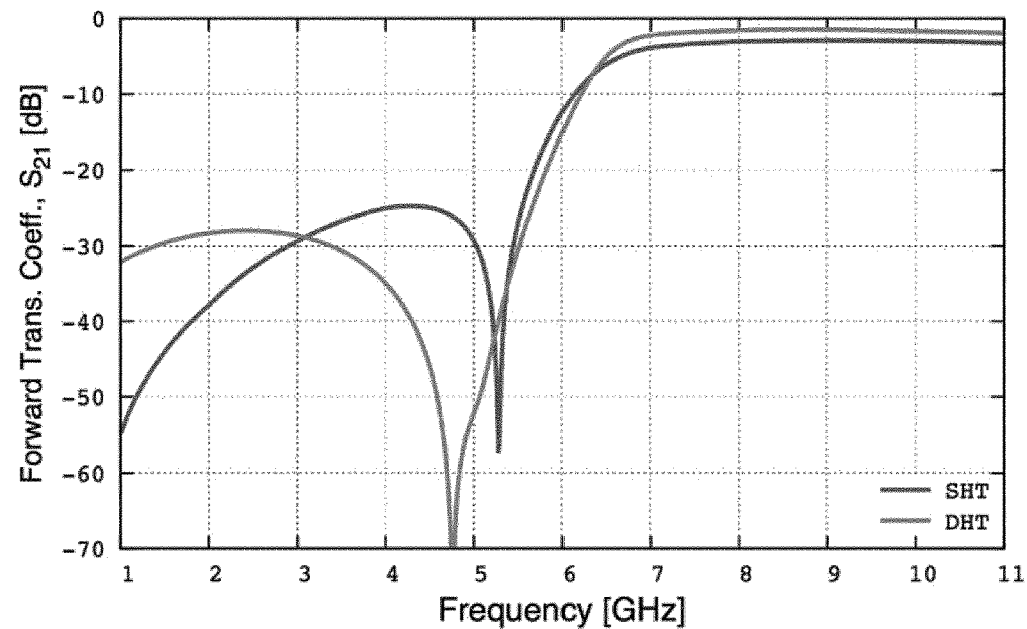
FIG. 16 is a graph comparing the forward transmission coefficients for the filter of FIG. 14 against a basic single harmonic trap filter.

FIG. 16 shows a comparison of the frequency response of a single harmonic trap (single parallel resonant circuit in the signal path) HPF with resonant frequency at approximately 5.3 GHz compared with the frequency response of a dual harmonic trap (two series resonant circuits such as those of FIG. 14) HPF.

It will be appreciated that many variations of the above embodiments may be made without departing from the scope of the invention which is defined by the appended claims.

The invention claimed is:

1. A differential circuit having a first positive arm and a second negative arm;
   wherein the first positive arm is a first filter circuit;
   wherein the second negative arm is a second filter circuit;
   wherein each of the first filter circuit and the second filter circuit comprises:
   a signal path for carrying a signal from an input to an output;
   the signal path comprising a first reactive component;
   a first node on the signal path;
   a first series resonant circuit comprising at least a second reactive component in series with a third reactive component, the first series resonant circuit being connected between the first node and a ground; and
   an active circuit;
   the active circuit comprising a voltage controlled current source connected to a second node on the signal path between the first node and the input of the signal path such that the voltage controlled current source is arranged to change the current flow through the second reactive component in dependence on a voltage at the second node;
   wherein the first series resonant circuit of the first filter circuit and the first series resonant circuit of the second filter circuit are connected together to form an AC ground.

2. A differential circuit as claimed in claim 1, wherein the second reactive component is an inductive component.

3. A differential circuit as claimed in claim 1, wherein the first reactive component is a capacitive component.

4. A differential circuit as claimed in claim 1, wherein the active circuit is arranged to change the current flow through the second reactive component in dependence on a voltage difference sensed across the first reactive component.

5. A differential circuit as claimed in claim 1, wherein each of the first filter circuit and the second filter circuit further comprises:
   a third node on the signal path;
   a second series resonant circuit comprising at least a fourth reactive component in series with a fifth reactive component, the second resonant circuit being connected between the third node and said ground; and
   an active circuit comprising a voltage controlled current source arranged to change the current flow through the fourth reactive component in dependence on a voltage sensed on the signal path.

6. A differential circuit as claimed in claim 5, wherein the fourth reactive component is an inductive component.

7. A differential circuit as claimed in any claim 5, wherein the signal path comprises at least one reactive component between the first node and the third node.

8. A differential circuit as claimed in claim 7, wherein the active circuit is arranged to change the current flow through the fourth reactive component in dependence on the voltage difference across the reactive component between the first node and the third node.

9. A differential circuit as claimed in claim 5, wherein the signal path further comprises a sixth reactive component and a seventh reactive component in series with the first reactive component; and
   wherein the first node is located between the first reactive component and the sixth reactive component and the third node is located between the sixth reactive component and the seventh reactive component.

10. A differential circuit as claimed in claim 1, wherein each of the first filter circuit and the second filter circuit further comprises a variable capacitor or capacitor bank connected between ground and a node between the second reactive component and the third reactive component.

11. A differential circuit as claimed in claim 1, the active circuit comprises:
   a current source arranged to draw current through a first amplifying element and thereby through the second reactive component, the first amplifying element being driven by the third node.

12. A differential circuit as claimed in claim 11, wherein the current source of the active circuit is arranged to draw current through a second amplifying element and thereby through the fourth reactive component, the second amplifying element being driven by the first node.

13. A differential circuit as claimed in claim 12, wherein the active circuit is a differential common-source amplifier.

14. A differential circuit as claimed in claim 1, wherein the first positive arm is connected to the second positive arm by a centre-tapped inductor with the AC ground formed at its centre tap, and wherein the centre-tapped inductor forms part of the first series resonant circuits of the first positive arm and the second negative arm.

15. A method of filtering a differential signal comprising:
   passing a positive part of the differential signal through a positive arm; and
   passing a negative part of the differential signal through a negative arm;
   wherein passing the respective part through the respective arm comprises:
   passing the signal along a signal path from an input to an output through a first reactive component;
   from a first node on the signal path, shorting the signal to ground through a first series resonant circuit at the resonant frequency of the first series resonant circuit, the first series resonant circuit comprising a second reactive component in series with a third reactive component; and
   using an active circuit comprising a voltage controlled current source connected to a second node on the signal path between the first node and the input of the signal path such that the voltage controlled current source draws current through the second reactive component, the active circuit changing the current flow through the second reactive component in dependence on a voltage at the second node;
   wherein the first series resonant circuit of the positive arm and the first series resonant circuit of the negative arm are connected together to form an AC ground.

* * * * *